(12) United States Patent
Chu Ke et al.

(10) Patent No.: US 8,054,410 B2
(45) Date of Patent: Nov. 8, 2011

(54) PIXEL STRUCTURE HAVING RED SUB-PIXEL, GREEN SUB-PIXEL, BLUE SUB-PIXEL AND WHITE SUB-PIXEL

(75) Inventors: Hui Chu Ke, Taoyuan County (TW);
Wei-Chieh Sun, Taipei County (TW);
Chun-Chieh Wang, Taipei County (TW); Sheng-Wen Cheng, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 315 days.

(21) Appl. No.: 12/406,977

(22) Filed: Mar. 19, 2009

(65) Prior Publication Data
US 2010/0128202 A1    May 27, 2010

(30) Foreign Application Priority Data
Nov. 21, 2008   (TW) .................................. 97145212

(51) Int. Cl.
*G02F 1/1335*    (2006.01)
(52) U.S. Cl. .......................................................... 349/69
(58) Field of Classification Search .................... 349/54, 349/69, 106, 144; 345/88, 589
See application file for complete search history.

(56) References Cited

U.S. PATENT DOCUMENTS
6,989,876 B2   1/2006   Song et al.
7,256,855 B2 * 8/2007   Baek .............................. 349/144
2006/0214942 A1   9/2006   Tanase et al.
2007/0091045 A1 * 4/2007   Hisatake ......................... 345/88
2007/0103491 A1 * 5/2007   Moriya et al. ................. 345/694
2007/0159492 A1 * 7/2007   Lo et al. ......................... 345/589

FOREIGN PATENT DOCUMENTS
CN   1484071   3/2004
CN   1713256   12/2005
CN   101013224   8/2007

OTHER PUBLICATIONS

"3rd Office Action of China Counterpart Application", issued on Aug. 24, 2010, p. 1-p. 4.
"3rd Office Action of European Counterpart Application", issued on Aug. 24, 2010, p. 1-p. 4.
"1st Office Action of China counterpart application", issued on Oct. 23, 2009, p. 1-p. 4.

* cited by examiner

*Primary Examiner* — Akm Ullah
(74) *Attorney, Agent, or Firm* — Jianq Chyun IP Office

(57) ABSTRACT

A pixel structure includes a red sub-pixel, a green sub-pixel, a blue sub-pixel and a white sub-pixel. The red sub-pixel, the green sub-pixel and the blue sub-pixel are suitable for providing a first white light, and a chroma coordinate of the first white light is $(x_1, y_1)$. The white sub-pixel is suitable for providing a second white light, and a chroma coordinate of the second white light is $(x_2, y_2)$. The chroma coordinate of the first white light is different from the chroma coordinate of the second white light, that is, $(x_1, y_1) \neq (x_2, y_2)$, while $x_2 \geq x_1$ and $y_2 \leq y_1$.

12 Claims, 7 Drawing Sheets

| RED | | GREEN | | BLUE | | WHITE | | NTSC |
|---|---|---|---|---|---|---|---|---|
| x | y | x | y | x | y | x | y | |
| 0.600 | 0.344 | 0.320 | 0.548 | 0.147 | 0.136 | 0.301 | 0.326 | 47.7% |
| 0.623 | 0.350 | 0.311 | 0.606 | 0.141 | 0.115 | 0.298 | 0.317 | 62.2% |
| 0.641 | 0.332 | 0.284 | 0.630 | 0.141 | 0.058 | 0.291 | 0.304 | 77.9% |

FIG. 4 (PRIOR ART)

PIXEL STRUCTURE HAVING RED SUB-PIXEL, GREEN SUB-PIXEL, BLUE SUB-PIXEL AND WHITE SUB-PIXEL

CROSS-REFERENCE TO RELATED APPLICATION

This application claims the priority benefit of Taiwan application serial no. 97145212, filed on Nov. 21, 2008. The entirety of the above-mentioned patent application is hereby incorporated by reference herein and made a part of specification.

BACKGROUND OF THE INVENTION

1. Field of the Invention

The present invention relates to a pixel structure, particularly relates to a pixel structure having a red sub-pixel, a green sub-pixel, a blue sub-pixel and a white sub-pixel.

2. Description of Related Art

As technology constantly advances, expectations of display quality of displays by people continuously increase. Not only are images of the displays desired to have high resolutions, high brightness and high contrast, displays are also desired to have advantages of light weight and low energy consumption. In conventional liquid crystal display (LCD) panels, a pixel structure thereof includes a red sub-pixel, a green sub-pixel and a blue sub-pixel. However, in LCD panels of portable electronic products, a pixel structure thereof may include a red sub-pixel, a green sub-pixel, a blue sub-pixel and a white sub-pixel. The white sub-pixel with high transmittance enhances overall brightness of the LCD panel, thereby reducing energy consumption of a backlight module. Hence, a multi-primary color display may also adopt a yellow sub-pixel other than the red sub-pixel, the green sub-pixel and the blue sub-pixel or other sub-pixels having higher transmittance to enhance overall brightness of the LCD panel, so as to reduce energy consumption of a backlight module.

Generally, color images displayed by the LCD panel must meet requirements of a manufacturer or international standards. In detail, under circumstances of using a D65, a D50 or a 9300K light source, a chroma coordinate of a white light displayed by the LCD display having the red sub-pixel, the green sub-pixel and the blue sub-pixel must be within a specific range, so that a correct white balance can be achieved. When the LCD panel has the red sub-pixel, the green sub-pixel, the blue sub-pixel and the white sub-pixel, the chroma coordinate of the white light displayed must also be within the above specific range. However, the chroma coordinate of the white light often shifts. At this moment a ratio of areas of the sub-pixels of different colors is modified (for example in U.S. Pat. No. 7,256,855 B2), or a spectrum of the backlight module is adjusted (for example in U.S. Pat. No. 6,989,876 B2), so that color shift of the white light is prevented to obtain the correct white balance.

Referring to FIG. 1, U.S. Pat. No. 7,256,855 B2 changes an area of the blue sub-pixel B, so that the area of the blue sub-pixel B is larger than an area of the green sub-pixel G and an area of the red sub-pixel R in order to increase ratio of blue light in the displayed image, thereby improving a phenomenon of the yellowish image.

In addition, in U.S. Pat. No. 6,989,876 B2, the spectrum of light emitted from the backlight is adjusted to solve the problem of color shift. In U.S. Pat. No. 6,989,876 B2, the spectrum of light emitted the backlight module used thereof is shown as spectrum blue 1.09 and spectrum blue 1.18 in FIG. 2. Compared with the spectrum blue 1, the spectrum blue 1.09 and the spectrum 1.18 have higher energy in a range of blue wavelengths and have lower energy in a range of red wavelengths, so that the spectrum blue 1.09 and the spectrum 1.18 may reduce a phenomenon of the yellowish image.

A chroma coordinate of a white light provided by a currently used white light-emitting diode is within an area surrounded by thick lines in FIG. 3. When the white light-emitting diode is used as a light source of the backlight module, chroma coordinates of red light, of green light, of blue light and of white light that may be generated by currently used red, green and blue filter films are shown in FIG. 4. When a color space to be displayed by the display panel is larger, color saturation of the red light, the green light and the blue light needs to be higher. At this moment, a y coordinate of the red light is smaller, an x coordinate of the green light is smaller, and both an x coordinate and a y coordinate of the blue light are smaller, and after color mixing, an x coordinate and an obtained y coordinate of the obtained white light are smaller. Therefore, the white light displayed by the display panel shifts towards blue-green. If the white balance is to be adjusted to within a predetermined range, the light emitted from the white light-emitting diode must shift towards red-orange. However, as limited by specifications the white light-emitting diodes currently produced, the white light-emitting diode that meets the above-mentioned requirements is difficult to purchase. Hence, methods of adjusting the backlight to improve the problems of the color shift are already facing a technological bottleneck.

Accordingly, no matter modifying the ratio of the areas of the pixels or adjusting the spectrum of the backlight module, costs and technical difficulties thereof have relatively increased.

SUMMARY OF THE INVENTION

The present invention provides a pixel structure which provides a correct white balance.

The present invention provides a pixel structure which includes a red sub-pixel, a green sub-pixel, a blue sub-pixel and a white sub-pixel. The red sub-pixel, the green sub-pixel and the blue sub-pixel are suitable for providing a first white light, and a chroma coordinate of the first white light is $(x_1, y_1)$; the white sub-pixel is suitable for providing a second white light, and a chroma coordinate of the second white light is $(x_2, y_2)$, wherein $(x_1, y_1) \neq (x_2, y_2)$, $x_2 \geq x_1$ and $y_2 \leq y_1$.

According to an embodiment of the present invention, the red sub-pixel, the green sub-pixel, the blue sub-pixel and the white sub-pixel are non-self-luminous sub-pixels.

According to an embodiment of the present invention, the non-self-luminous sub-pixels include LCD sub-pixels.

According to an embodiment of the present invention, the red sub-pixel is suitable for displaying a red light having a chroma coordinate of $(x_R, y_R)$, the green sub-pixel is suitable for displaying a green light having a chroma coordinate of $(x_G, y_G)$, the blue sub-pixel is suitable for displaying a blue light having a chroma coordinate of $(x_B, x_B)$, and $0.67 \geq x_R \geq 0.57$, $0.35 \geq x_G \geq 0.25$, $0.15 \geq x_B \geq 0.13$, $0.35 \geq y_R \geq 0.32$, $0.65 \geq y_G \geq 0.53$, $0.14 \geq y_B \geq 0.05$.

According to an embodiment of the present invention, the chroma coordinate of the first white light is $(x_1, y_1)$, $0.31 \geq x_1 \geq 0.28$ and $0.33 \geq y_1 \geq 0.29$.

According to an embodiment of the present invention, the red sub-pixel, the green sub-pixel and the blue sub-pixel are non-self-luminous sub-pixels, and the white sub-pixel is a self-luminous sub-pixel.

According to an embodiment of the present invention, the non-self-luminous sub-pixels include LCD sub-pixels, and the self-luminous sub-pixel includes organic electro-luminescence display sub-pixels.

According to an embodiment of the present invention, $x_2 \geq 0.29$.

According to an embodiment of the present invention, $y_2 \leq 0.325$.

According to an embodiment of the present invention, a chroma coordinate after the first white light and the second white light are mixed is $(x_3, y_3)$, $0.32 \geq x_3 \geq 0.29$ and $0.33 \geq y_3 \geq 0.3$.

According to an embodiment of the present invention, the white sub-pixel comprises a yellow additive.

According to an embodiment of the present invention, the yellow additive comprises yellow levelers, adhesives, surfactants, binders, monomers, photo-initiators, or yellow color-resists.

The present invention uses the second white light provided by the white sub-pixel to obtain the required white balance, and there is no need to adjust the ratio of the areas of the sub-pixel or the spectrum of the backlight module. The present invention therefore has better practicability.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a schematic diagram showing chroma coordinates of red light, green light, blue light and white light generated by using a white light-emitting diode as a backlight module in conjunction with current red, green and blue filter films.

DESCRIPTION OF EMBODIMENTS

Figure 1:
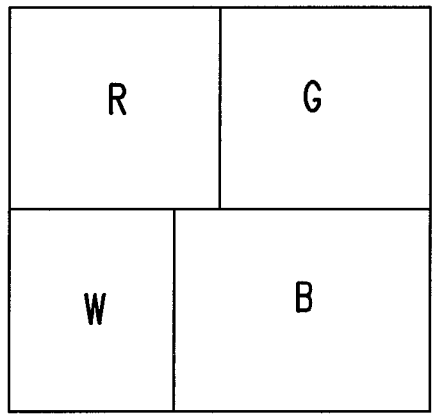
FIG. 1 is a schematic diagram showing a conventional pixel structure.
Figure 2:
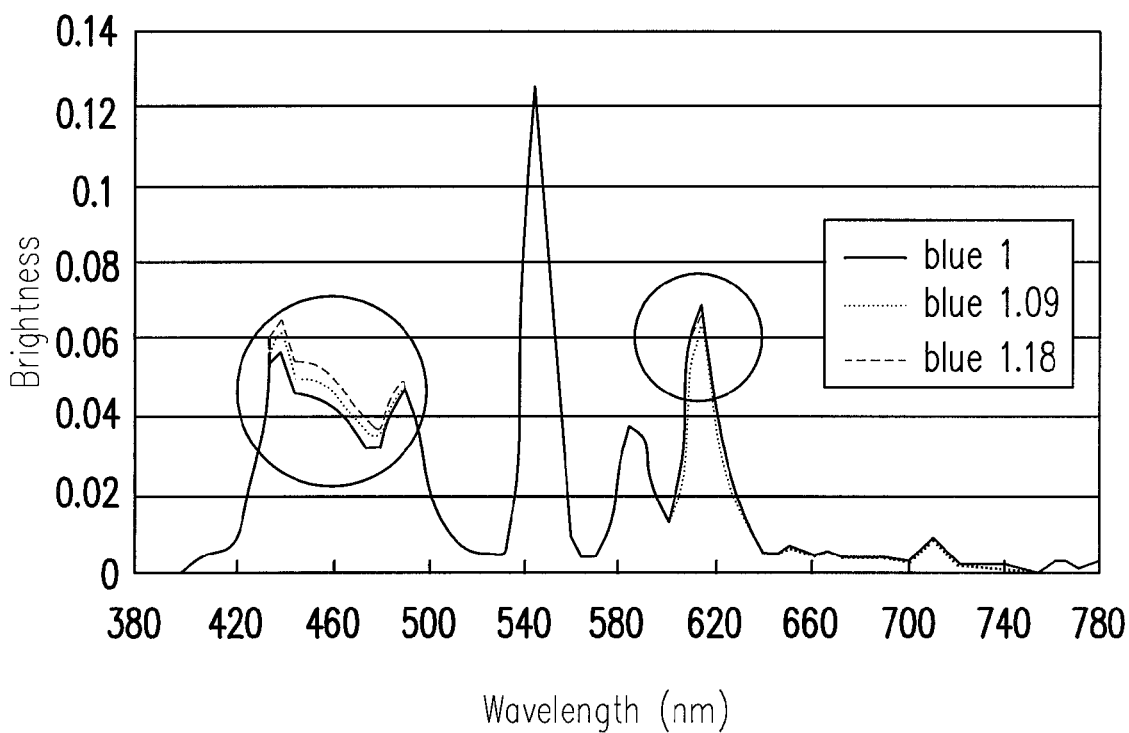
FIG. 2 is a schematic diagram showing a spectrum of a conventional backlight module used to adjust a white balance.
Figure 3:
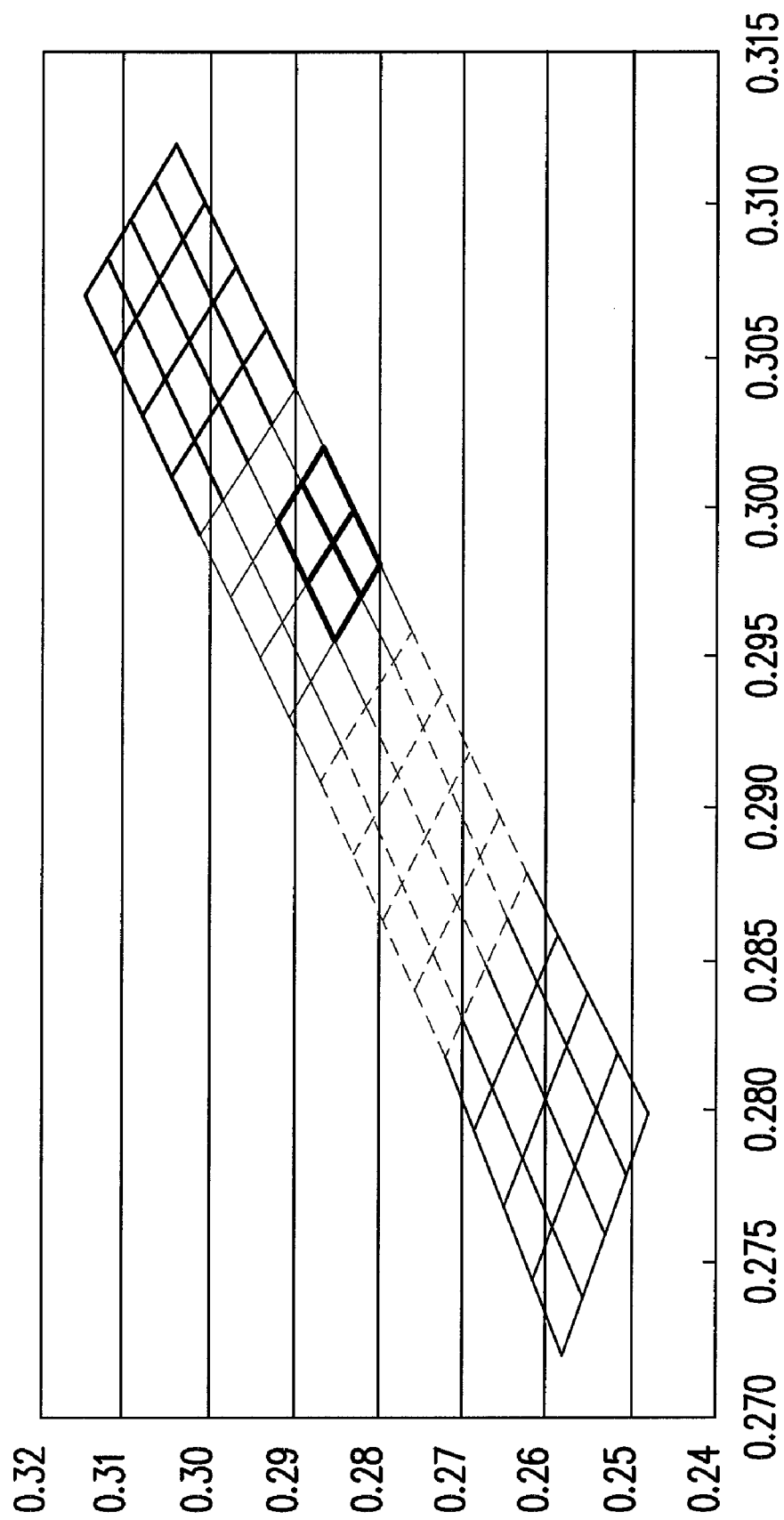
FIG. 3 is a schematic diagram showing a range of a chroma coordinate of a white light provided by a currently used white light-emitting diode.
Figure 5A:
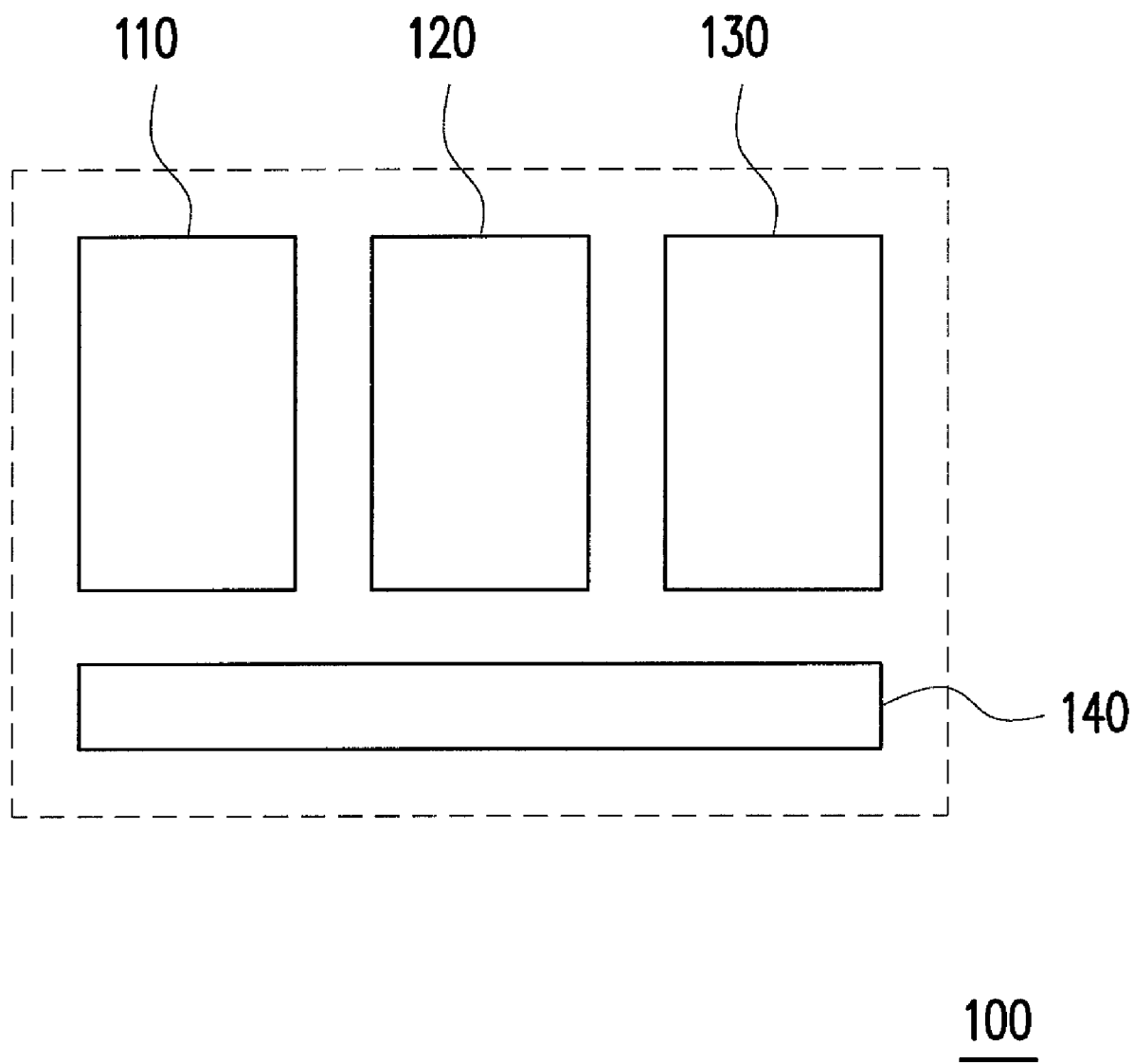
FIG. 5A is a schematic diagram of a pixel structure according to an embodiment of the present invention.

FIG. 5A is a schematic diagram of a pixel structure according to an embodiment of the present invention. Referring to FIG. 5A, a pixel structure 100 includes a red sub-pixel 110, a green sub-pixel 120, a blue sub-pixel 130 and a white sub-pixel 140, and the red sub-pixel 110, the green sub-pixel 120 and the blue sub-pixel 130 are suitable for providing a first white light W1 having a chroma coordinate $(x_1, y_1)$, while the white sub-pixel 140 is suitable for providing a second white light having a chroma coordinate $(x_2, y_2)$, wherein $(x_1, y_1) \neq (x_2, y_2)$, $x_2 \geq x_1$ and $y_2 \leq y_1$.

According to the present embodiment, the red sub-pixel 110, the green sub-pixel 120, the blue sub-pixel 130 and the white sub-pixel 140 may be non-self-luminous sub-pixels, for example LCD sub-pixels. By using a backlight module to make the red sub-pixel 110, the green sub-pixel 120 and the blue sub-pixel 130 in the pixel structure 100 display a red light having a chroma coordinate $(x_R, y_R)$, a green light having chroma coordinates $(x_G, y_G)$ and a blue light having chroma coordinates $(x_B, x_B)$ respectively, ranges of the chroma coordinate of the red light, the green light and the blue light generated through the LCD sub-pixels are respectively $0.67 \geq x_R \geq 0.57$, $0.35 \geq x_G \geq 0.25$, $0.15 \geq x_B \geq 0.13$, $0.35 \geq y_R \geq 0.32$, $0.65 \geq y_G \geq 0.53$ and $0.14 \geq y_B \geq 0.05$.

The first white light W1 generated after color mixing of the red light $(x_R, y_R)$, the green light $(x_G, y_G)$ and the blue light $(x_B, x_B)$ has a range of chroma coordinates of: $0.31 \geq x_1 \geq 0.28$, and $0.33 \geq y_1 \geq 0.29$. The white light having the range of the chroma coordinate shifts more towards blue-green as compared with a predetermined white light having a predetermined range of the chroma coordinate, and a phenomenon of a color shift becomes more apparent as color saturation increases. In order to improve the phenomenon of the color shift towards blue-green of the first white light W1, the chroma coordinate of the second white light W2 may be adjusted within a specific range of a chroma coordinate (for example $x_2 \geq 0.29$ and $y_2 \leq 0.325$), so that the second white light W2 shifts more toward red-orange compared with the first white light W1. Through compensation of the second white light W2, a white light W3 generated from mixing of the first white light W1 and the second white light is adjusted to the predetermined range of the chroma coordinate. According to the present embodiment, a coordinate of the white light W3 obtained by mixing the first white light W1 and the second white light W2 is $(x_3, y_3)$, and the predetermined range of the chroma coordinate is $0.32 \geq x_3 \geq 0.29$ and $0.33 \geq y_3 \geq 0.3$.

Figure 5B:
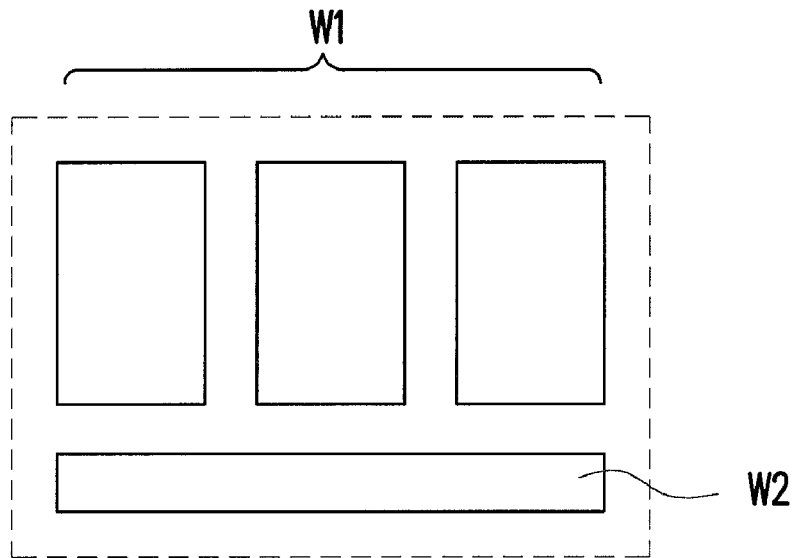
FIG. 5B is a relationship diagram showing chroma coordinates of a first white light, a second white light and a white light after color mixing according to an embodiment of the present invention.
Figure 5B:
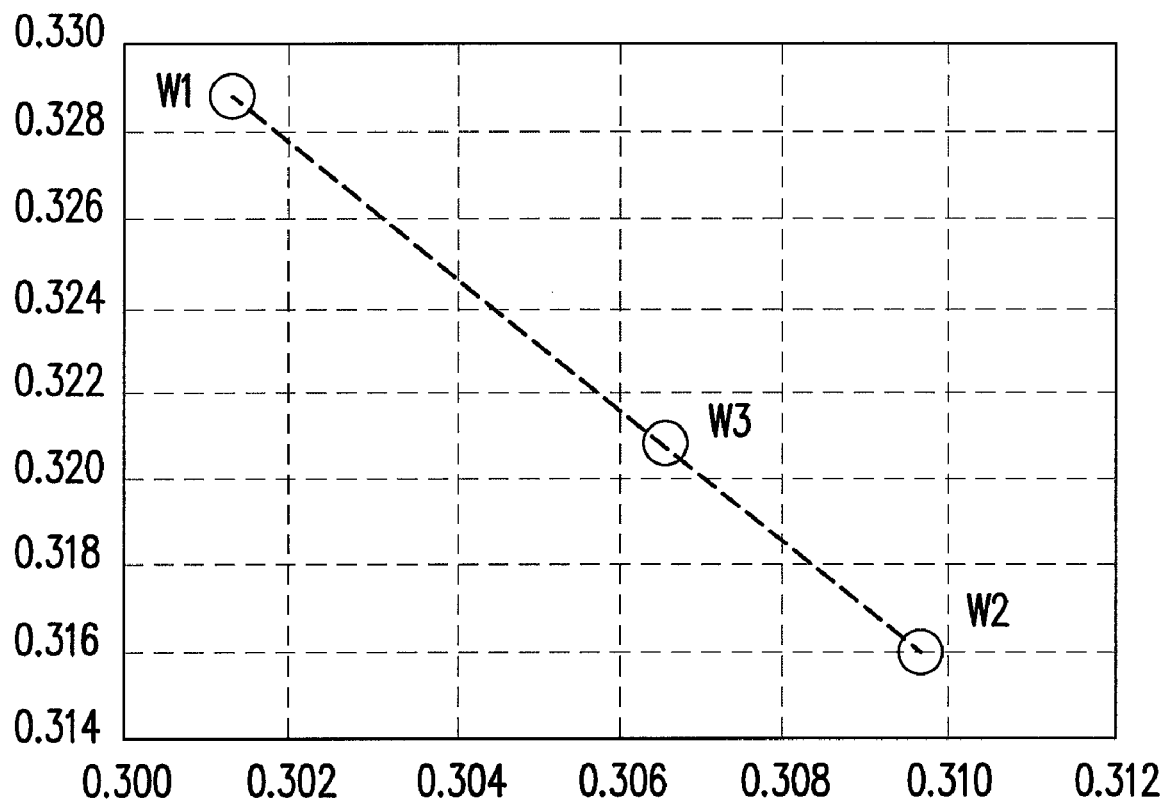

Referring to FIG. 5B, the white sub-pixel 140 provides the second white light W2 with the chroma coordinate $(x_2, y_2)$ different from the chroma coordinate $(x_1, y_1)$ of the first white light W1, and the range of the chroma coordinate of the second white light W2 is $x_2 \geq 0.29$ and $y_2 \leq 0.325$. Compared with the first white light W1 that shifts more towards blue-green, the second white light W2 shifts more toward red-orange, so that $x_2 \geq x_1$, and $y_2 \leq y_1$. After mixing the first white light W1 and the second white light W2, the chroma coordinate thereof must be between W1 $(x_1, y_1)$ and W2 $(x_2, y_2)$. Therefore, through adjusting the second white light W2, the problem of the color shift towards blue-green of the white light W3 of the displayed image is reduced, so that the chroma coordinate $(x_3, y_3)$ of the third white light W3 generated from mixing of the first white light W1 and the second white light W2 is within the predetermined range of the chroma coordinate.

Figure 6A:
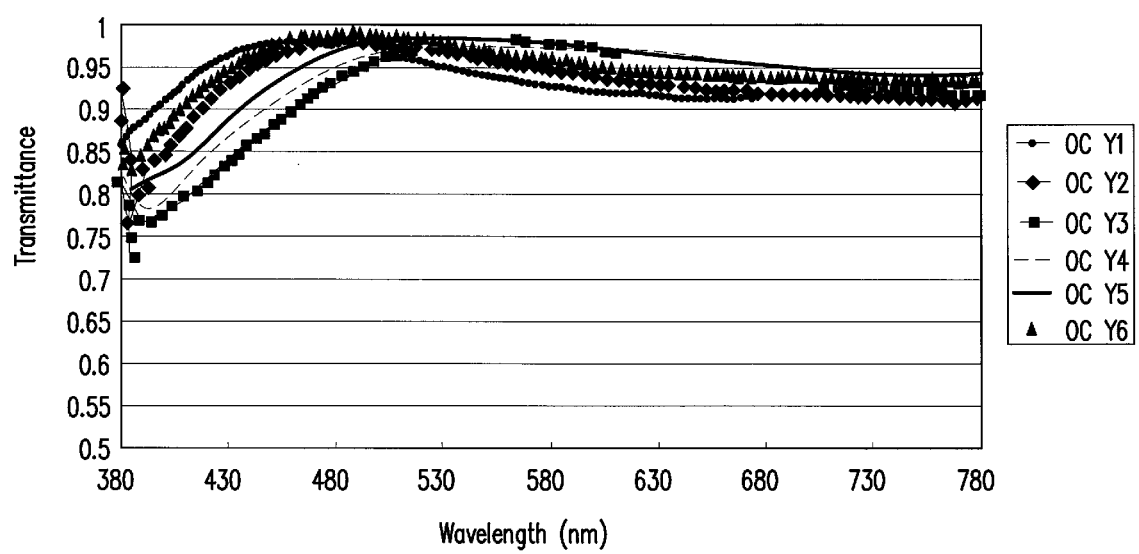
FIG. 6A is a relationship diagram showing wavelengths and transmittance of a light source when passing through a white photoresist with yellow fluorescent powder or yellow paint added.
Figure 6B:
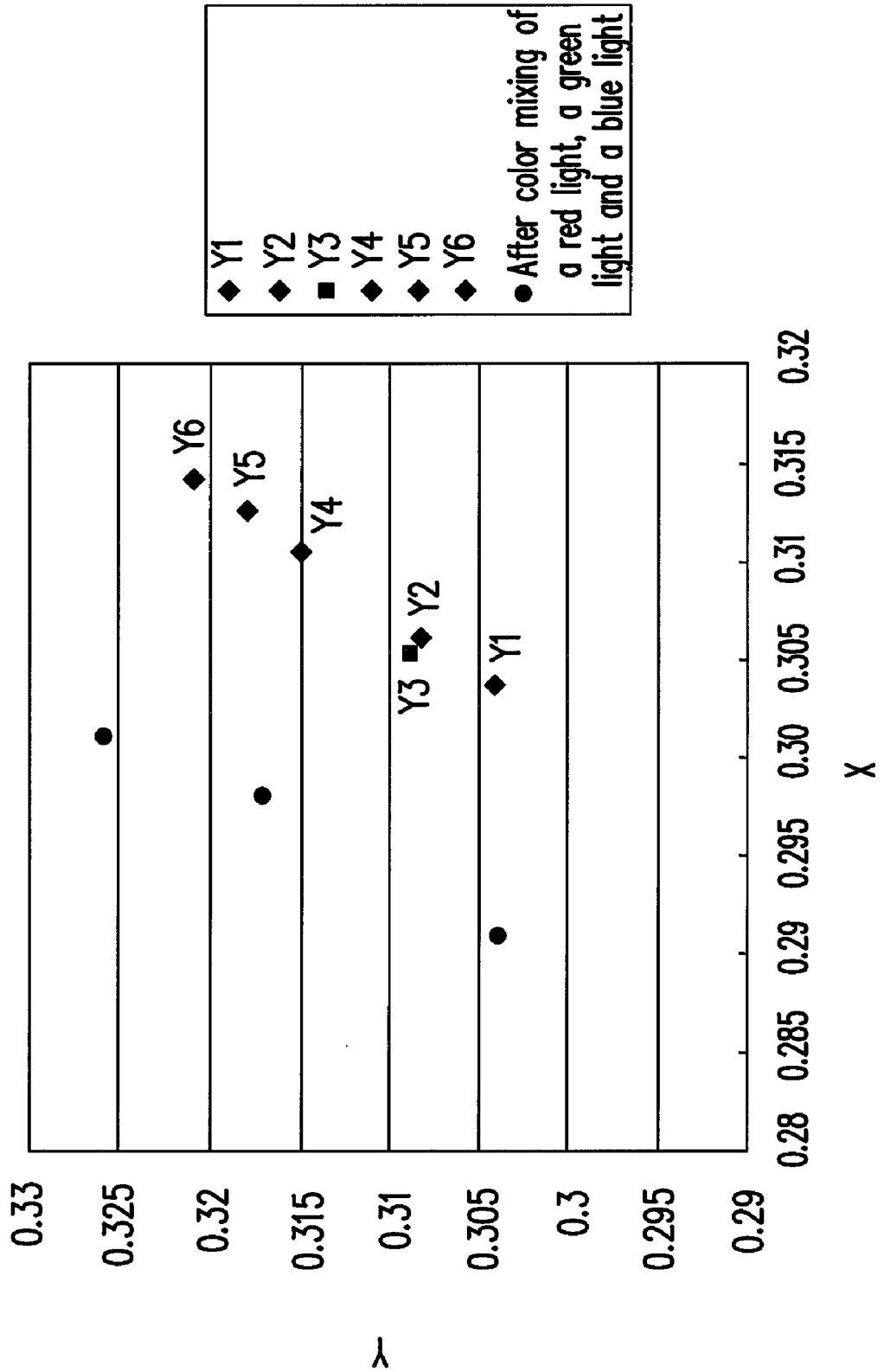
FIG. 6B is a schematic diagram showing chroma coordinates of a second white light displayed by a first white light passing through a white photoresist with yellow fluorescent powder or yellow paint added.

According to the present embodiment, in order to adjust the second white light W2, a method of adding a yellow color-resist (e.g. yellow fluorescent powder) to the white sub-pixel 140 may be used. When the yellow fluorescent powder in a white photoresist of white sub-pixel 140 increases, the transmittance corresponding to blue wavelengths decreases. A relationship between the transmittance and the wavelength is shown in FIG. 6A. Hence the second white light W2 displayed by the white sub-pixel 140 with the yellow fluorescent powder added therein shifts more towards yellow than the second white light W2 displayed by the white sub-pixel 140 without the yellow fluorescent powder added therein. Please refer to FIG. 6B. By changing ingredients of the yellow fluorescent powder, the second white light W2 is properly adjusted to compensate for the problem of the color shift towards blue of the first white light W1, so that the white balance is within the predetermined range. In FIG. 6B, after color mixing of a red light, a green light, and a blue light, the first white light W1 is generated and chroma coordinate of the first white light W1 are represented by round dots. Additionally, chroma coordinate of the second white light W2 displayed by the white sub-pixel 140 with the yellow fluorescent powder added therein are represented by rhombus dots Y1~Y6.

A method of making the white sub-pixel 140 shift towards yellow may be increasing a heating time during production, or adjusting ingredients of the color-resist in the white sub-pixel 140, or simultaneously increasing the heating time during the production and adjusting the ingredients of the color-resist, so that the white sub-pixel 140 shifts toward yellow.

In order to adjust the ingredients of the color-resist of the white sub-pixel 140, in addition to using yellow additives including yellow levelers, adhesives, surfactants, binders, monomers or photo-initiators, yellow color-resists may also be added.

According to another embodiment that is not shown in figures, the red sub-pixel 110, the green sub-pixel 120 and the blue sub-pixel 130 included in the pixel structure 100 may be non-self-luminous sub-pixels, for example LCD sub-pixels, and the white sub-pixel 140 may be an self-luminous sub-pixel, for example an organic electro-luminescence display sub-pixel. The organic electro-luminescence display sub-pixel (the white sub-pixel 140) can be driven by current so as to emit the second white light W2.

In summary of the above, since the relationship between the chroma of the first white light ($x_1$, $y_1$) generated by color mixing of the red sub-pixel, the green sub-pixel and the blue sub-pixel in the pixel structure and the chroma of the second white light ($x_2$, $y_2$) generated by the white sub-pixel is properly designed in the present invention, the white balance of the displayed image of the present invention is within the predetermined range of the chroma coordinate. The pixel structure of the present invention is simple and there is no need for adjusting the spectrum of the backlight module or modifying the ratio of the area of the sub-pixel. Additionally, the present invention can reduce difficulty in manufacturing, save manufacturing costs and enhance practicability of engineering applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
   a red sub-pixel;
   a green sub-pixel;
   a blue sub-pixel, wherein the red sub-pixel, the green sub-pixel and the blue-sub pixel are suitable for providing a first white light, and a chroma coordinate of the first white light is ($x_1$, $y_1$); and
   a white sub-pixel for providing a second white light, and a chroma coordinate of the second white light being ($x_2$, $y_2$), wherein ($x_1$, $y_1$)≠($x_2$, $y_1$), $x_2 \geq x_1$ and $y_2 \leq y_1$.

2. The pixel structure of claim 1, wherein the red sub-pixel, the green sub-pixel, the blue sub-pixel and the white sub-pixel are non-self-luminous sub-pixels.

3. The pixel structure of claim 2, wherein the non-self-luminous sub-pixels comprise liquid crystal display sub-pixels.

4. The pixel structure of claim 1, wherein the red sub-pixel is suitable for displaying a red light having a chroma coordinate of ($x_R$, $y_R$), the green sub-pixel is suitable for displaying a green light having a chroma coordinate of ($x_G$, $y_G$), the blue sub-pixel is suitable for displaying a blue light having a chroma coordinate of ($x_B$, $x_B$), $0.67 \geq x_R \geq 0.57$, $0.35 \geq x_G \geq 0.25$, $0.15 \geq x_B \geq 0.13$, $0.35 \geq y_R \geq 0.32$, $0.65 \geq y_G \geq 0.53$ and $0.14 \geq y_B \geq 0.05$.

5. The pixel structure of claim 1, wherein the chroma coordinate of the first white light is ($x_1$, $y_1$), $0.31 \geq x_1 \geq 0.28$ and $0.33 \geq y_1 \geq 0.29$.

6. The pixel structure of claim 1, wherein the red sub-pixel, the green sub-pixel and the blue sub-pixel are non-self-luminous sub-pixels and the white sub-pixel is an self-luminous sub-pixel.

7. The pixel structure of claim 6, wherein the non-self-luminous sub-pixels comprise liquid crystal display sub-pixels, and the self-luminous sub-pixel comprises an organic electro-luminescence sub-pixel.

8. The pixel structure of claim 1, wherein $x_2 \geq 0.29$.

9. The pixel structure of claim 1, wherein $y_2 \leq 0.325$.

10. The pixel structure of claim 1, wherein a chroma coordinate after the first white light and the second white light are mixed is ($x_3$, $y_3$), $0.32 \geq x_3 \geq 0.29$ and $0.33 \geq y_3 \geq 0.3$.

11. The pixel structure of claim 1, wherein the white sub-pixel comprises a yellow additive.

12. The pixel structure of claim 11, wherein the yellow additive comprises yellow levelers, adhesives, surfactants, binders, monomers, photo-initiators, or yellow color-resists.

* * * * *

UNITED STATES PATENT AND TRADEMARK OFFICE
CERTIFICATE OF CORRECTION

PATENT NO. : 8,054,410 B2
APPLICATION NO. : 12/406977
DATED : November 8, 2011
INVENTOR(S) : Chu Ke et al.

It is certified that error appears in the above-identified patent and that said Letters Patent is hereby corrected as shown below:

Column 6, line 15, "$(x_1, y_1) \neq (x_2, y_1)$" should be changed to --$(x_1, y_1) \neq (x_2, y_2)$--; line 27, "$(x_B, x_B)$" should be changed to --$(x_B, y_B)$--.

Signed and Sealed this
Twenty-ninth Day of May, 2012

David J. Kappos
*Director of the United States Patent and Trademark Office*